United States Patent [19]
Sato

[11] Patent Number: 5,242,561
[45] Date of Patent: Sep. 7, 1993

[54] PLASMA PROCESSING METHOD AND PLASMA PROCESSING APPARATUS

[75] Inventor: Yasue Sato, Kawasaki, Japan

[73] Assignee: Canon Kabushiki Kaisha, Tokyo, Japan

[21] Appl. No.: 743,409

[22] PCT Filed: Dec. 14, 1990

[86] PCT No.: PCT/JP90/01634

§ 371 Date: Aug. 14, 1991

§ 102(e) Date: Aug. 14, 1991

[87] PCT Pub. No.: WO91/09150

PCT Pub. Date: Jun. 27, 1991

[30] Foreign Application Priority Data

Dec. 15, 1989 [JP] Japan .................................. 1-325445

[51] Int. Cl.[5] .......................................... C23F 4/04
[52] U.S. Cl. ............................ 204/192.33; 156/345; 156/643; 156/646; 204/298.32; 204/298.38
[58] Field of Search ................. 156/643, 646, 345; 204/192.32, 192.33, 298.06, 298.08, 298.34, 298.32, 298.38

[56] References Cited

U.S. PATENT DOCUMENTS

| 4,693,805 | 9/1987 | Quazi ................... 204/298.34 X |
| 4,844,767 | 7/1989 | Okudaira et al. ......... 204/298.34 X |
| 4,950,376 | 8/1990 | Hayashi et al. .......... 204/298.34 X |
| 4,950,377 | 8/1990 | Huebner ................. 204/298.34 |

Primary Examiner—Nam X. Nguyen
Attorney, Agent, or Firm—Fitzpatrick, Cella, Harper & Scinto

[57] ABSTRACT

A plasma processing method characterized by placing a work to be processed on a work electrode being installed in a vacuum vessel and repeating alternately the following first step and the following second step; the first step comprising carrying out ion irradiation by applying a negative voltage to said work electrode while controlling said voltage such that the voltage of said work electrode versus the potential of said plasma be maintained constant, whereby making the energy possessed by ion to be irradiated to said work to be processed to provide an energy dispersed state as desired; and the second step comprising irradiating electrons in said plasma to said work to be processed by applying a positive voltage to said work electrode. And, an apparatus suitable for practicing said plasma processing method.

3 Claims, 12 Drawing Sheets

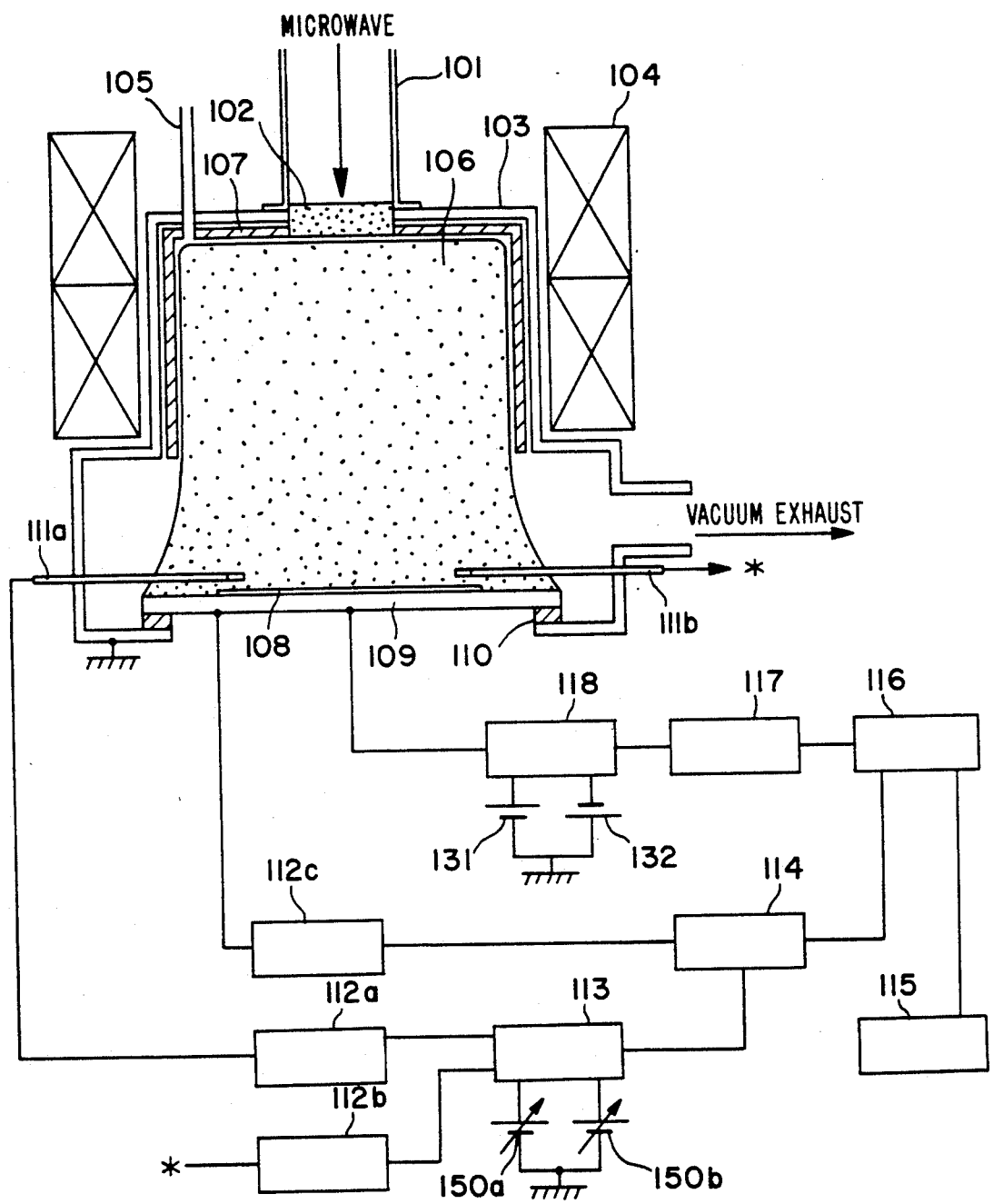
FIG. I(A)

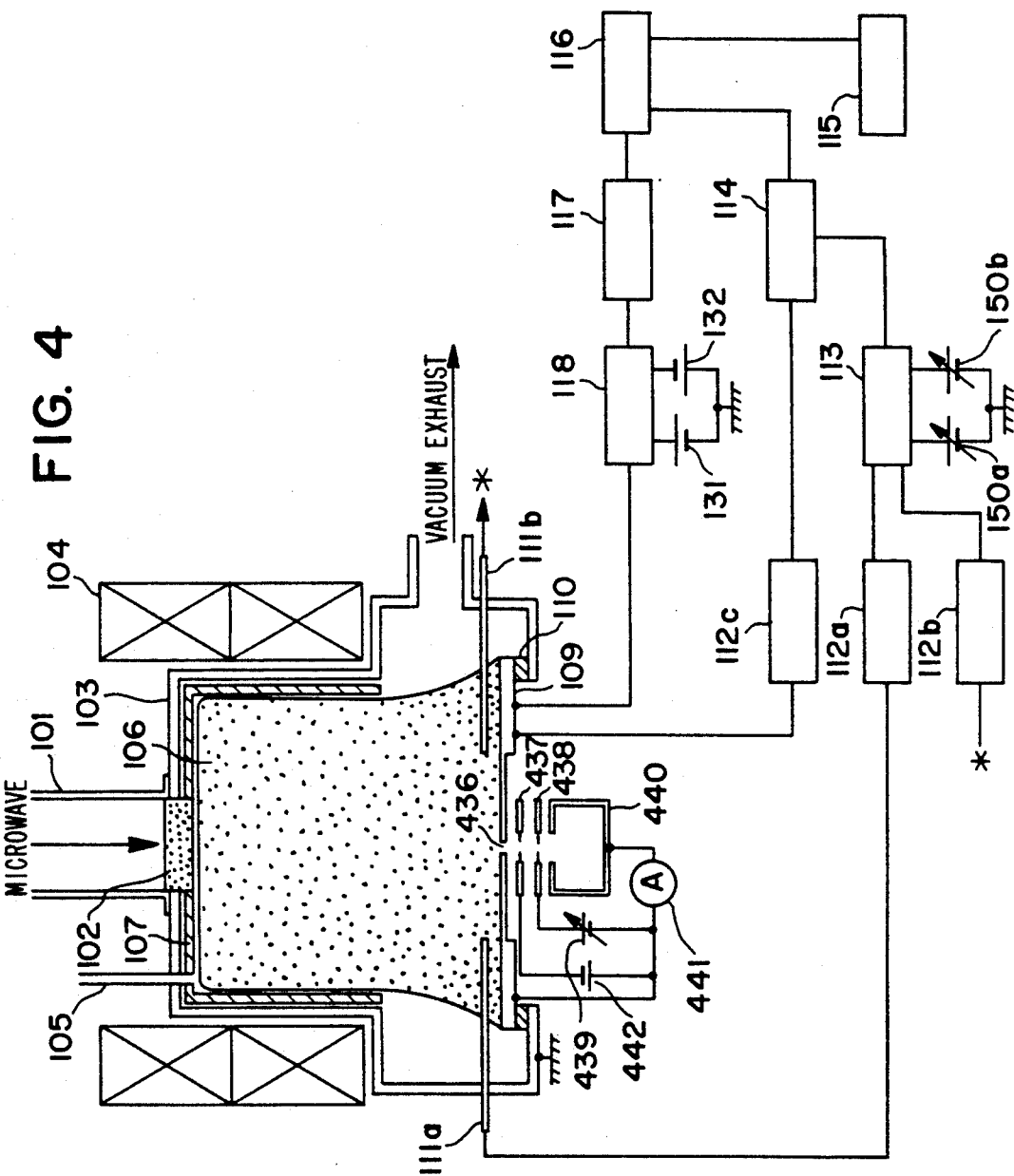

PLASMA PROCESSING METHOD AND PLASMA PROCESSING APPARATUS

THE FIELD TO WHICH THE INVENTION PERTAINS

The present invention relates to a plasma processing method capable of practicing plasma processing at the time of performing etching, resist-ashing or film-formation particularly for a semiconductor wafer utilizing plasma and an apparatus suitable for practicing said plasma processing method.

The term "plasma processing method" in this specification means a processing in which highly active radicals and ions produced by plasmanizing a specific material are contacted with a work for example, substrate etc.) to thereby perform processing such as etching, film deposition, sputtering, cleaning or ashing for the work. And, the term "processing apparatus" means an apparatus to be used for practicing said plasma processing method.

BACKGROUND OF THE INVENTION

The conventional plasma processing apparatus comprises a plasma processing chamber comprising a vacuum vessel having a raw material gas inlet opening and a discharge opening and a means for supplying electromagnetic wave or the like in order to supply energy for producing plasma of a raw material gas.

The plasma processing method to be practiced using such plasma processing apparatus utilizes high energy of radicals or ions and is applicable to various desired processes including etching and film deposition by selectively deciding processing conditions such as the respective densities of the radicals and ions, the temperature of a work, etc. A method of controlling ions with electric charges is employed in order to efficiently carrying out those processes.

Specifically, there is known a method in which a medium capable of imparting energy for producing plasma in order to provide a plasma state, a high-frequency magnetic wave of 13.56 MHz is applied to the processing gas to produce plasma, by which an energy is provided for the ions to reach the work, thereby performing the control of the ions. This method can be practiced using an apparatus shown in FIG. 9. FIG. 9 is a view schematically illustrating an example of the reactive ion etching apparatus (RIE) for etching a work by producing plasma by the action of a high-frequency magnetic wave of 13.56 MHz. see, Applied Physics, vol. 51, volume 3, pp. 350 (1982))

In the reactive ion etching apparatus shown in FIG. 9, a work electrode 909 is placed in a vacuum vessel 903 through an insulator 910, and a counter electrode 920 is arranged while facing to the work electrode 909. Plasma 906 is formed in a space between the work electrode 909 and the counter electrode 920, and a work 908 on the work electrode 909 is etched by the action of the resulting plasma. Numeral reference 905 stands for a processing gas inlet opening and numeral reference 923 stands for a matching box.

Explanation is to be made about the case of etching a Si substrate using $Cl_2$ gas in the etching process using the above apparatus shown in FIG. 9.

First, the work Si substrate 908 to be etched is positioned on the work electrode 909 and the inside of the vacuum vessel 903 is evacuated by an exhausting system to a vacuum degree of less than $10^{-4}$ Torr for example.

Then, the $Cl_2$ gas as the etching gas is introduced into the vacuum vessel 903 through the gas inlet opening 905, and the inside of the vessel is maintained at 0.05 Torr for example. A high-frequency power from a high-frequency power source 919 is applied through the matching box 923 to the work electrode 909 to thereby produce plasma 906 between the work electrode and the counter electrode 920.

Herein, the work electrode 909 in contact with the plasma 906 is electrically isolated from earth electric potential by way of the insulator 910 and a condenser (not shown) in the matching box 923. Because of this, a negative bias voltage (this is also called a cathode drop voltage; its degree is about a maximum value Vm of the high-frequency to have been applied) is induced at the work electrode 909 due to the difference between the mobility of an electron and that of an ion. And ions are accelerated with the action of the bias voltage to collide the work 908 together with radicals, whereby the work is etched. In this case, the ion energy is controlled by adjusting the high-frequency power to be applied and varying the bias voltage.

However, in the case of using this RIE apparatus, the ion energy to reach the surface of the work has an extent of about 2 eVm (the e herein is the charge quantity of an electron) and because of this, damage caused on the work due to ions having a high energy becomes seriously problematic in the case where the surface state at the surface of the work is important. On the other hand, in the case of performing the etching while reducing the ion energy, that is, reducing the high-frequency voltage (reducing the high-frequency power) in order to prevent occurrence of such damage, there is caused a different problem that the etching rate is reduced accordingly, wherein an appropriate etching rate cannot be attained as desired. Under these circumstances, there is an increased demand for provision of such a plasma processing method that excels in the controllability, does not cause damage at the surface of a work and provides a high processing speed.

The above prior art is to perform etching by producing plasma with the application of high frequency energy to impart energy to ions. Other than this, there is known a plasma processing method in which microwave is used in order to produce plasma and a high frequency power is applied to a work electrode in order to control the energy of ion to be irradiated to a work. According to this processing method, the plasma processing can be carried out with a good controllability since the control of plasma state and the control of the energy of an ion to be impinged to the work can be independently performed on each other. An example of the apparatus for this method is described in Japanese Patent Publication Sho.56(1981)-37311. This apparatus is of the constitution which is schematically shown in FIG. 10.

In the case where the apparatus of FIG. 10 is used for etching process, microwave generated by a microwave generating device 123 (magnetron, for instance) propagates in a waveguide 101 and is absorbed by an etching gas (introduced through a leak valve 124) being controlled, for example, to less than 1 atmospheric pressure in a vessel 107 made of an insulating material which is placed in a mirror field provided by a magnetic field-causing coil 104 and a permanent magnet 127.

In a processing chamber 125, there are provided a gas inlet opening 105, a gas discharge opening 126, a work electrode 109, a work 108, said permanent magnet 127, and an insulator 130. Active ions in plasma 106 as produced are impinged into the work 108 along the mirror field to thereby etch the surface of the work 108. At this time, the work 108 and the work electrode 109 are applied with an AC voltage of a high frequency magnetic wave as shown in the figure. As its application means, there is a manner that a high frequency power source 119 is connected to an upstream coil of an air-core transformer 128 of about 1:1 in turn ratio, the work electrode 109 is connected to one end of a downstream coil, and a capacitor 129 is connected to the other end of said downstream coil. And the other end of the capacitor 129 is electrically grounded. The circumferential wall of the processing chamber 125 is provided with the insulator 130 to electrically float the work electrode 109. The work electrode 109 is made of an electrically conductive material and because of this, the high frequency voltage applied to the work electrode 109 is applied also to the work concurrently. The capacitor 129 has a capacity of about 0.1 $\mu F$ for example, and it functions to make the work 108 isolated from the earth in a direct current-like manner and to allow only a high frequency current to pass through the capacitor.

Therefore, the situation becomes such that a high frequency voltage negatively biased by Vf as Vs shown in FIG. 11 is applied to the work electrode 109. Ions (the ions mentioned hereinafter mean positive ions; and they are mostly monovalent) which arrive at the work (or the work electrode 109) or electrons are accelerated or decelerated due to an electric potential difference Vs—Vp with the plasma potential Vp. The mean bias value Vf is decided so that the quantity of arrival electric charges of those ions becomes equal to that of those electrons in terms of time average. The Vp herein is of a value of 10 to 20 V. As for its wave form, shown in FIG. 11 is a sine wave in terms of expediency. In practice, the wave form is somewhat varied due to nonlinear effects of the plasma.

Here, the ion energy arriving at the work 108 has an energy of e (Vf−$\overline{Vp}$)(e herein is a charge quantity of the electron) on the average and $\overline{Vp}$ becomes greatly smaller than Vf (Vf) $\overline{Vp}$). Because of this, the ion energy arriving at the work can be approximated to be about eVf. Ions collide the work with this average energy, whereby the work is desirably processed. The value of this energy can be properly controlled by the Vs, particularly, the power to be outputted by the high frequency power source. Such control makes it possible to conduct processing with a good controllability or to conduct high speed processing with ions having a high energy.

By the way, in general, in the case of subjecting a wafer of Si or SiO$_2$ to plasma processing with the use of an ion energy, there is a slight occasion for the work to be damaged as long as ions having an energy of less than 100 eV are used. However, the processing speed is heightened as the energy increases, and because of this, the energy width of an ion to be used for conducting the processing at a high speed without causing damage for the work is required to be narrow. The situation for this energy width to be narrowed is schematically shown in FIG. 12. The figure illustrates the situation where the number of ions having an energy of 100 eV or nearby this is markedly large and on the other hand, the number of other ions having an energy of other value than that in the former is markedly small. And, in the case where starting at the border of certain energy for ions, deposition comes to cause in a region where the energy is low and etching comes to cause in a region where the energy is high, use of ions having an energy with a narrow energy width makes it easier to control the processing. FIG. 13 illustrates the situation where deposition or etching is caused depending upon the magnitude of the energy of an ion to be used. However, in the prior art, because the voltage to be applied to the work is varied as shown in FIG. 11, the energies of ions to be impinged into the work are distributed up to 2e at the maximum Vo—Vpo)(where Vo and Vpo are maximum values of the Vp and Vs shown in the figure). For instance, when a high frequency voltage of Vo=100 V is applied, there will be caused ions having an energy of 100 eV on the average and about 200 eV at the maximum. Therefore, the energy width for the ions is eventually spread. Because of this, there is a problem that it is impossible to constantly and perform plasma processing at a high speed and with high efficiency.

SUMMARY OF THE INVENTION

The present invention makes it a principal object to overcome the foregoing problems and to provide a plasma processing method which enables to perform plasma processing at a high speed and with a high efficiency without causing a damage for a work by using ions which have an energy value being controlled to desired value and which are small in energy variance.

Another object of the present invention is to provide a plasma processing method which enables to constantly perform plasma processing with an excellent controllability.

A further object of the present invention is to provide an apparatus suitable for practicing the above plasma processing.

The present invention has been accomplished as a result of repeated studies by the present inventor in order to solve the foregoing problems in the prior art and in order to attain the above objects.

The plasma processing method to be provided according to the present invention is of the constitution as will be described below.

That is, a plasma processing method comprising introducing a processing gas into a vacuum vessel containing a work to be treated being placed on a work electrode therein, applying a plasma generating energy to said processing gas to cause plasma and treating the work to be treated with the resultant plasma, characterized by repeating alternately the following first and second steps, the first step: carrying out ion irradiation by applying a negative voltage to said work electrode while controlling said voltage such that the voltage of said work electrode versus the the potential of said plasma is maintained constant, whereby making ions having an energy to be irradiated from said plasma to said work to be treated to provide a dispersed state as desired with respect to their energies; and the second step: irradiating electrons in said plasma to said work to be treated by applying a positive voltage to said work electrode.

The present invention includes a plasma processing apparatus suitable for practicing the above plasma processing method. The plasma processing apparatus is of the constitution as will be described below.

That is, a plasma processing apparatus comprising a vacuum vessel having an electrode on which a work to be treated can be positioned therein, said vacuum vessel being capable of confining plasma capable of performing plasma treatment for said work; gas supply means for supplying a processing gas to be used for the treatment of said work to be treated into said vacuum vessel; exhaust means for vacuum-evacuating the inside of said vacuum vessel; and voltage applying means for applying a voltage to said work electrode and controlling ions in said plasma to be impinged into said work to be treated, characterized in that said voltage applying means is designed such that a positive voltage and a negative voltage can be alternately applied and the voltage of said work electrode versus the potential of said plasma can be controlled to be constant when the voltage of said work electrode versus the the potential of said plasma is negative.

According to the plasma processing method or the plasma processing apparatus respectively of the above-mentioned constitution according to the present invention, desirable plasma processing can be performed at a high speed and with a high efficiency since energy distribution of ions arriving at the surface of a work to be treated can be completed in a desired state and the value of energy of those ions can be properly controlled. Particularly, for instance, in the case of performing etching, extremely efficient etching can be performed by completing energy of ions arriving at the surface of the work to be in a desired state suitable for etching. Likewise, in the case of performing film-formation, it is possible to form a deposited film excelling in characteristics with a high efficiency by completing said energy of ions to be of a high magnitude while not causing damage to the surface of the work.

BRIEF DESCRIPTION OF THE DRAWING

FIG. 1(A) is a schematic view illustrating an embodiment of the plasma processing apparatus of the present invention.

FIG. 4 is sa schematic view illustrating an embodiment of the plasma processing apparatus of the present invention.

DETAILED EXPLANATION OF THE PREFERRED EMBODIMENTS

Figure 1B:
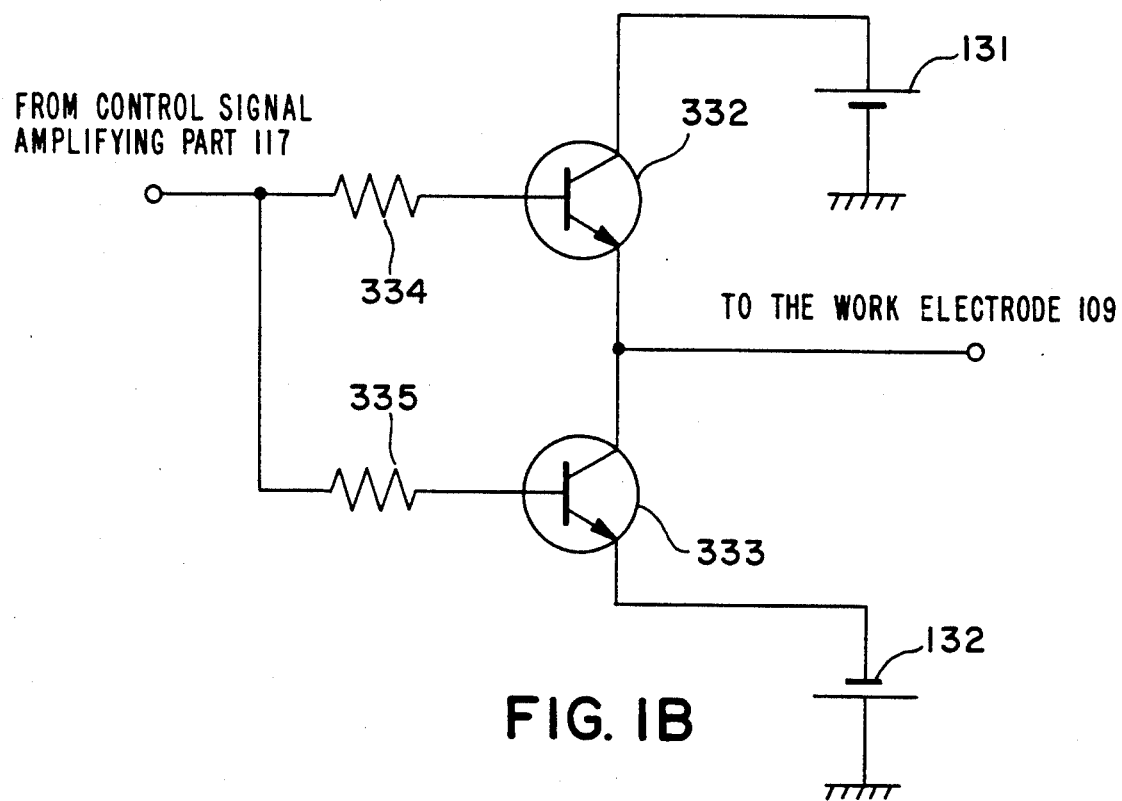
FIG. 1(B) is a circuit diagram illustrating an embodiment of a circuit usable in the plasma processing apparatus of the present apparatus.

In the following, the present invention will be explained in more detail while referring to the drawings.

FIG. 1(A) is a schematic view illustrating a preferred embodiment of the plasma processing apparatus using microwave according to the present invention. In the figure, numeral reference 101 stands for a waveguide for supplying microwave, numeral reference 102 stands for a microwave transmitting window through which microwave transmits, numeral reference 103 stands for a vacuum vessel made of a metal, numeral reference 104 stands for an air-cored coil for providing a magnetic field in the vacuum vessel 103, and numeral reference 105 stands for a gas inlet opening for introducing a processing gas into the vacuum vessel. Numeral reference 106 stands for plasma generated in the vacuum vessel, numeral reference 107 stands for an insulating vessel made of quartz, alumina, etc., numeral reference 108 stands for a work to be treated, numeral reference 109 stands for a work electrode made of a conductive material on which the work 108 is to be positioned, and numeral reference 110 stands for an insulator for electrically isolating the work electrode 109 from earth-electric potential. Each of numeral references 111a and 111b stands for a langmuir probe for measuring a potential of the plasma 106, and each of numeral references 112a, 112b and 112c stands for an attenuator. Numeral reference 113 stands for a plasma potential appreciation system for appreciating and computing a potential Vp of the plasma based on the voltage detected by the langmuir probes 111a and 111b. Each of numeral references 150a and 150b stands for a DC power source for setting an outer voltage for computing a plasma potential at the position where the langmuir probe 150a or 150b is located. Numeral reference 114 stands for a system for appreciating the voltage between the plasma and the work electrode which is capable of computing a potential Vsp of the work electrode 109 versus the plasma and outputting a signal relating to the voltage of the work electrode. Numeral reference 115 stands for a reference waveform signal-outputting system which serves to output a reference waveform signal having an ideal waveform to be applied to the work electrode 109. Numeral reference 116 stands for a comparison and control signal-outputting system which serves to compare the signal relating the voltage of the work electrode with the reference waveform signal whereby detecting a difference between them and to output a signal relating to controlling the voltage of the work electrode. Numeral reference 117 stands for a control signal-amplifying system which serves to amplify the above signal outputted. Numeral reference 118 stands for a work electrode voltage-controlling system which serves to control the voltage of the work electrode using the signal amplified to be such that it has a waveform identical to that of the reference voltage and the value of said waveform comes to have a desired value. Each of numeral references 131 and 132 stands for a DC power source which serves to supply a DC power to the work electrode voltage-controlling system 118.

In the plasma processing apparatus described above, the ideal waveform should be properly set up depending upon the kind of the plasma processing to be practiced. However, in general, a waveform having a positive potential and a negative potential is set up so that the work electrode 109 is not in a state of being charged up.

In the following, explanation is to be made about an example of the process of the plasma processing using the plasma processing apparatus having the foregoing constitution.

First, a processing gas (for example, $CHF_3$ or the like in the case of etching $SiO_2$; $SF_6$, $Cl_2$, etc. in the case of etching Si; $SiH_4+N_2+H_2$ or the like in the case of forming a SiN film; $O_2$, or the like in the case of ashing a novolak type resist) is introduced into the vacuum vessel 103 through the gas inlet opening 105. The vacuum vessel 103 is vacuum evacuated to bring its inside to a desired processing pressure (for example, a vacuum of $5\times10^{-4}$ to $1\times10^{-1}$ Torr) The inside of the vacuum vessel is maintained at this pressure. Then, a magnetic field is caused in the vacuum vessel 103 by actuating the air-cored coil 104.

Thereafter, microwave (of 2.45 GHz in usual case) from a magnetron oscillator (not shown in the figure) is forced to propagate through the waveguide 101 and transmit through the microwave transmitting window 102 being hermetically sealed between the vacuum vessel 103 and the waveguide 101 into the insulating vessel 107.

In this way, there is caused plasma 106 in the vacuum vessel 103. In this case, when the magnitude of the magnetic field is made to be a value (875 Gauss) at which an electron cyclotron resonance is caused to the microwave of 2.45 GHz, the microwave is effectively absorbed to produce highly dense plasma.

There are various methods for appreciating the plasma potential Vp. The plasma processing apparatus of FIG. 1 is configured such that it can be appreciated by using the langmuir probes 111a and 111b. The langmuir probes 111a and 111b herein are desired to be installed at the position over the work electrode 109 while leaving between them an interval (for example, about 0.5 mm to about 1 cm) of being several times to several tens times over the length of an ion sheath caused between the plasma and the work electrode 109. In this embodiment, it is so designed that the measurement is carried out by the two langmuir probes. However, it is desired to further increase the number of the langmuir probes in order to improve the measuring accuracy.

A specific example of the method of appreciating the plasma voltage is to be explained.

That is, first, each of the langmuir probes 111a and 111b is made to be of a floating potential of the plasma 106 without externally applying any voltage thereto. Herein, the respective values are assumed to be Vpf-a and Vpf-b, respectively. Each of the floating potentials Vpf-a and Vpf-b induced respectively at the langmuir probes 111a or 111b is made to be a voltage suitable for successive appreciation treatment by the attenuator 112a or 112b. In this embodiment, it is possible to transform the voltage inputted into these attenuators to a value of 1/10 thereof. The voltage thus transformed to 1/10 is inputted into the plasma potential appreciating system 113.

Specifically, in the case where the pressure in the vacuum vessel 103 is less than $10^{-2}$ Torr, collision among ions within the ion sheath is slightly caused, and because of this, from the Bohm condition, the plasma potential Vp can be expressed by the following equation (1):

$$V_p = V_T + V_{pf} \quad (1)$$

wherein $V_T = \frac{kTe}{2e} \ln\left(\frac{m_i}{2.26m_e}\right)$

In the above, k is a Boltzman's constant, Te is an electron temperature, and $M_i$ is a mass of an ion.

Since the electron temperature Te is substantially not changed during the process, it is possible to measure the volt-ampere characteristic of each of the langmuir probes 111a and 111b and to determine each of the electron temperatures Te-a and Te-b at each of the measuring positions. Particularly, as apparent from the equation (1), each of the plasma potentials Vpa and Vpb at the respective measuring positions can be easily obtained by detecting each of the floating potentials Vpf-a and Vpf-b and detecting each of the electron temperatures Te-a and Te-b.

In more detail, the value of $V_T$, that is, the value of each of $V_T$-a and $V_T$-b at the position where each of the langmuir probes 111a and 111b is situated is computed, and the value corresponding to, for example, 1/10 of the resultant value in each case is inputted into the plasma potential appreciating system 113 by properly adjusting - each of the setting DC power sources 150a and 150b. Then, using an adding circuit comprising an operation amplifier in the plasma appreciating system 113 as the fundamental element, each of the plasma potentials Vp-a=$V_T$-a+Vpf-a and Vp-b=$V_T$-b+Vpf-b at the position where each of the langmuir probes 111a and 111b is situated is calculated to obtain a plasma potential in each case, and the mean value of the Vp-a and the Vp-b is obtained by an average-calculating circuit. This value has a magnitude corresponding to 1/10 of the actual value, and it is outputted as a signal relating to the plasma potential.

The work electrode voltage Vps (versus earth potential) is transformed by the attenuator 112c at the same transformation ratio of 1/10 as in the the above case and for the same reason as in the above case where the voltage of the floating potential Vpf of the plasma is transformed by using each of the attenuators 112a ad 112b. The work electrode voltage Vps transformed to 1/10 is outputted as a signal relating to the work electrode voltage from the attenuator 112c.

In the appreciating system 114 for the voltage between the plasma and the work electrode into which the signal relating to the plasma potential and the signal relating to the work electrode voltage versus the earth potential have been inputted, the plasma-work electrode voltage signal is subtracted from the signal relating to the work electrode voltage versus the earth potential by the calculating circuit therein to obtain a work electrode voltage Vps to the plasma, and the resultant is outputted as a signal relating to the plasma-work electrode voltage. The value of Vps in this case is corresponding to 1/10 of the actual value.

Figure 2:
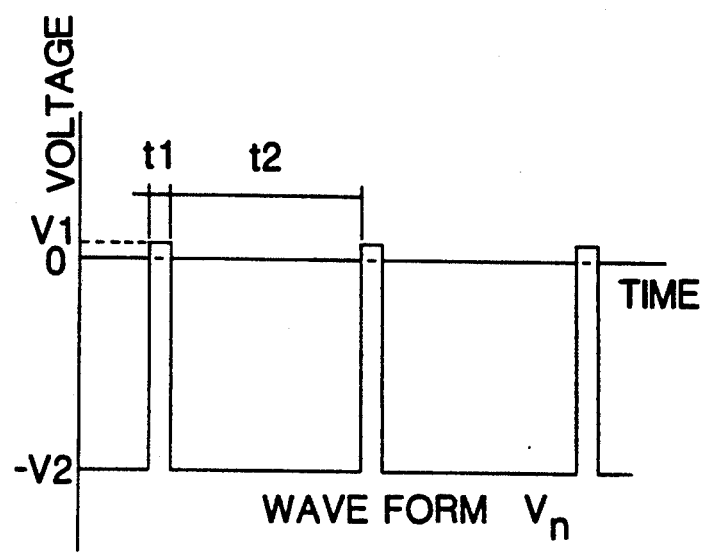
FIG. 2 illustrates an example of the reference waveform outputted from a reference waveform signal-outputting mechanism which is applicable as a constituent of the plasma processing apparatus of the present invention.

Shown in FIG. 2 is of a signal $V_R$ relating to the reference waveform which is outputted by the reference waveform signal-outputting system 115. The reference waveform signal $V_R$ is identical to the ideal waveform of the voltage between the plasma and the work.

And its value has been transformed to a value of 1/10 for example.

In FIG. 2, $t_1$ stands for a period of time when an electron current is flown into the work electrode 109 from the plasma, $t_2$ stands for a period of time when an ion current is flown into the work electrode 109 from the plasma 106, and each of $V_1$ and $-V_2$ stands for a voltage corresponding to 1/10 of the voltage of the work electrode 109 versus the plasma 106 during the respective period of time.

First, consideration is to be made about the period of time with respect to each of $t_1$ and $t_2$. During the period of time $t_2$, ions are flown into the work electrode 109 to process the work 108. If nothing is done in this case, the charges of the ions flown stay at the work electrode 109 to heighten the voltage of the work electrode 109, whereas the number of electrons is increased in comparison with that of ions in the plasma 106 and this results in decreasing the plasma potential, wherein ions stop flowing into the work electrode 109 shortly.

In this respect, during this period of time $t_2$, in order to maintain the energy of the ions arriving at the work electrode 109 constant, the voltage $V_{PR}$ between the plasma and the work is maintained constant and control of making the energy received from the magnetic field between the plasma and the work constant is carried out as follows.

That is, the signal relating to the voltage between the plasma and the work electrode obtained the appreciating system 114 for the voltage between the plasma and the work electrode and the reference waveform signal obtained from the reference waveform signal-outputting system 115 are inputted into the control signal-outputting system 116, wherein a signal corresponding to a difference between the two inputted signals is outputted by the action of a differential amplifier. The signal outputted is then amplified by the control signal-amplifying system 117 and inputted into the work electrode voltage-controlling system 118.

Shown in FIG. 1(B) is an example of the fundamental circuit of the foregoing work electrode voltage-controlling system to be used in the present invention. In FIG. 1(B), numeral reference 332 stands for an npn-type transistor, numeral reference 333 stands for a pnp-type transistor, each of numeral references 334 and 335 stands for an electric resistor for controlling a base current of each of said transistors, and each of numeral references 131 and 132 stands for a DC power source.

In the work electrode voltage-controlling system having such constitution as mentioned above the transistors 332 and 333 are positioned between the DC power source 131 and the DC power source 132. The voltage between the collector and the emitter (of the transistors 332 and 333) is controlled by the current flowing through the bases of the transistors controlled by the control signal outputted from the control signal-amplifying system 117, and as a result, the voltage $V_{ps}$ to be applied to the work electrode 109 versus the plasma is maintained at a constant value, for example, $-10 V_2$.

Since the voltage of the work electrode 109 is constant to the plasma 106, the energy of ion arriving at the work can be completed to a constant value, for example, $-10$ $eV_2$. Accordingly, plasma processing can be performed by using ions of a narrow energy width. And, also with respect to the energy of ion, appropriate precise control is possible by varying the value $V_2$.

The length of $t_2$ is determined due to the control limit of the work electrode voltage-controlling system 118. As for the $t_2$, it may be a certain period of time less than that. For instance, it may be made to be a constant value of less than the period of 10 $\mu$sec. Other than this, the length of the $t_2$ may be determined by transmitting a control limit signal from the work electrode voltage-controlling system 118 to the reference waveform signal-outputting system 115.

Next, consideration is to be made about the $t_1$. During the $t_1$, the plasma potential descended and the work electrode voltage raised (the earth potential is the reference in each of the two cases) during the $t_2$, are respectively raised and lowered. During the $t_1$, an electron having a high traveling speed is flown into the work electrode from the plasma 106, and because of this, the $t_1$ may be shorter than the $t_2$.

The range for the value of the $t_1$ when $V_1 \geq 0$ and under the Bohm condition is such as expressed by the following equation:

$$t_1 \geq 1.5 \left( \frac{m_e}{m_i} \right)^{\frac{1}{2}} t_2 \tag{2}$$

Herein, when the mass of Mi is made to be about 10 in terms of mass number (almost all the ions are of more than 10 in mass number), the situation becomes:

$$t_1 \geq 1.1 \times 10^{-2} t_2 \tag{3}$$

From the above, it is understood that the $t_1$ should satisfy the equation (3).

Figure 3:
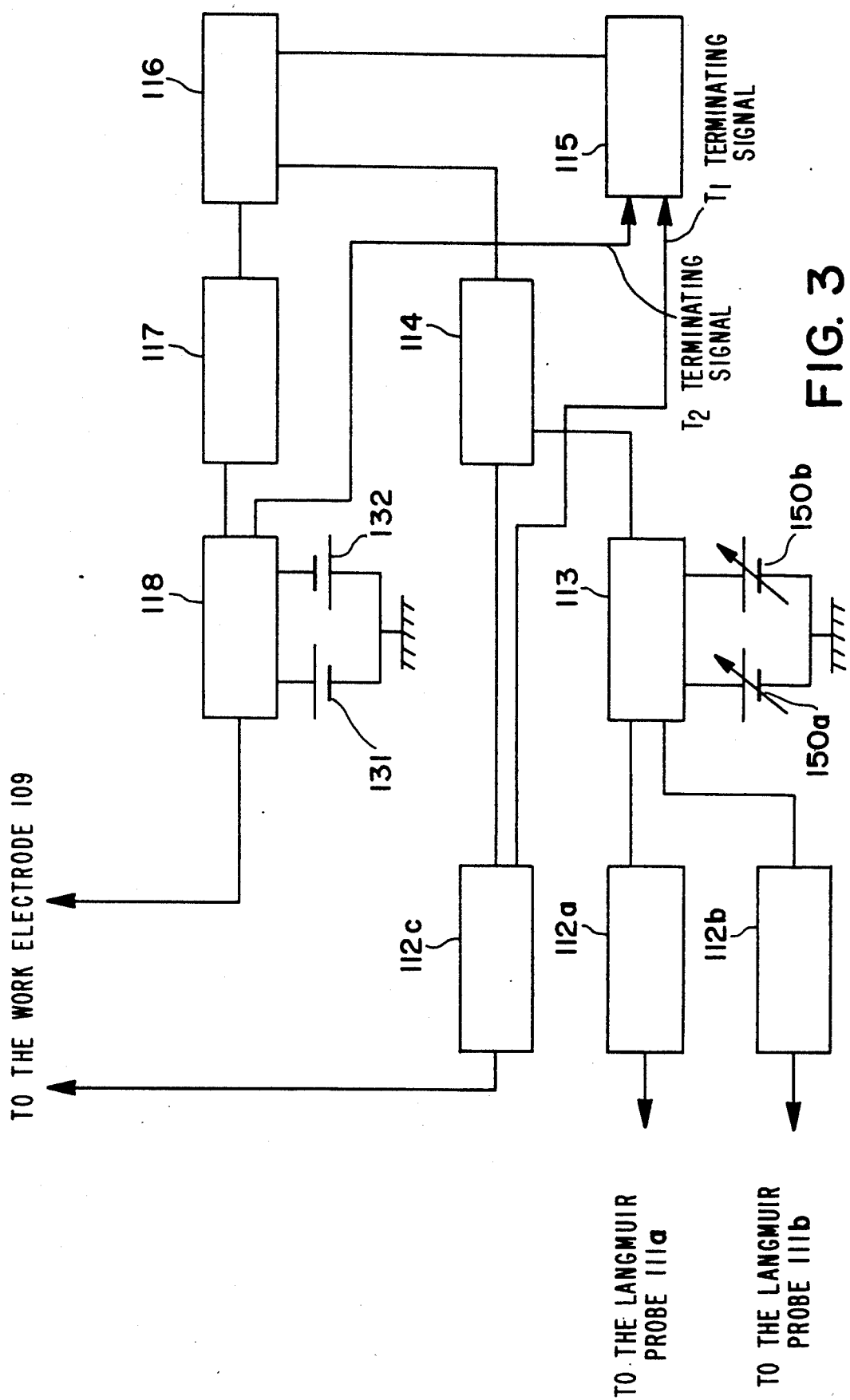
FIG. 3 is a schematic view illustrating an embodiment of a control mechanism for controlling the voltage of a work in the plasma processing apparatus of the present invention.

However, when the situation stays at $V_1 > 0$ for an excessive period of time, both the plasma potential Vp and the work electrode voltage are excessively lowered (the earth potential is the reference in each of the cases). Therefore, when either the plasma potential or the work electrode voltage becomes to be a certain value (for example, a value obtained when the work electrode voltage is not controlled, or the earth potential), it is possible to terminate the $t_1$ by outputting a signal to terminate the $t_1$ from the attenuator 112c and transmitting the signal to the reference waveform signal-outputting system 115. (see, FIG. 3)

In the case of using a signal to determine the above $t_1$ and $t_2$, a constant voltage having a negative value should be caused at the reference voltage-outputting system 115. In this case, said constant voltage may be of a reference voltage waveform not having such voltage part with a positive value as shown in FIG. 2.

The waveform of the $V_R$ during the period of time of the $t_1$ is maintained constant without being changed during the period of time of the $t_1$ in the case of FIG. 2. However, during this period of time, it is not necessary for the energy of electron to be maintained constant, and because of this, any waveform can be employed as long as the $V_1$ during this period of time satisfies the equation: $V_1 \geq 0$.

In addition, in the the case where the insulating vessel 107 is not present, the potential of the plasma 106 is not largely changed since the potential of the plasma 106 is in contact with the vacuum vessel 103, the plasma 106 in said vacuum vessel being maintained at the earth potential.

In the case where the change in the potential of the plasma 106 is slight as described above it, is not substantially problematic even if the work electrode voltage is used instead of the plasma-work electrode voltage. In view of this, it is possible to simplify the apparatus.

The plasma processing apparatus as explained above is for the case using microwave. However, the apparatus according to the present invention may be optionally structured t be of other constitution in which other energy than microwave is used. As an embodiment of such apparatus, there is shown an apparatus using high frequency magnetic wave in FIG. 8.

Figure 8:
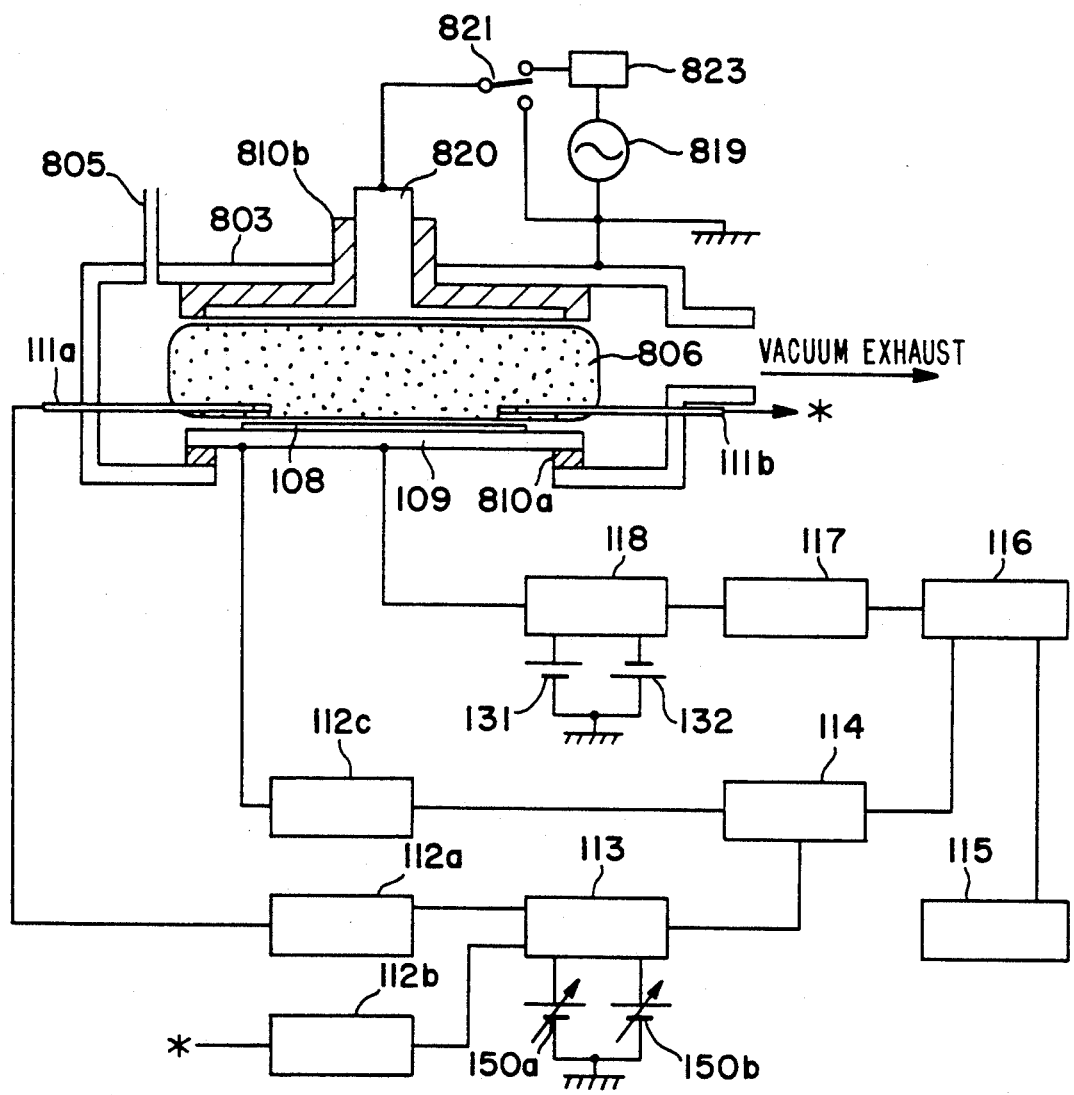
FIG. 8 is a schematic view illustrating an embodiment of the plasma processing apparatus of the present invention.

In FIG. 8, numeral reference 803 stands for a vacuum vessel, numeral reference 805 stands for a gas inlet opening, numeral reference 806 stands for plasma, numeral references 810a and 810b stand for respectively an insulator, and numeral reference 819 stands for a high frequency power source. Numeral reference 820 stands for an upper electrode which is electrically isolated from the vacuum vessel 803 by the insulator 810b and which is situated opposite to the work electrode 109. Numeral reference 823 stands for a matching box, and numeral reference 821 stands for a switch. The same numeral references as those in FIG. 1 are respectively of the same meaning as that expressed by the corresponding numeral reference in FIG. 1.

In the case of using the apparatus of FIG. 8, a work 108 is first positioned on the work electrode 109, and the inside of the vacuum vessel 803 is sufficiently vacuum-evacuated. Then, a processing gas of the same kind as in the foregoing case is introduced through the gas inlet opening 805, and the pressure in the vacuum vessel is maintained at a vacuum of, for example, $10^{-3}$ to 1 Torr. Successively, the switch 821 is positioned on the side of the high frequency power source 819. And, the high frequency power source 819 having a specific frequency, for example, in the frequency range of 1 to 300 MHz is oscillated to apply a high frequency power to the upper electrode 820. In this way, plasma 806 is caused between the upper electrode 820 and the work electrode 109. In this case, the matching box 823 is adjusted such that a reflecting electric power becomes minimum. Successive procedures after this are the same as those explained in the case of the apparatus of FIG. 1.

The plasma processing apparatus of the present invention may take other constitution than those described above. An embodiment of such constitution is to be explained in the following.

That is, in the case where the switch 821 is positioned on the earth side and the upper electrode 820 is grounded, the situation comes to a result that electrical connection is not present between the high frequency power source 819 and the upper electrode 820. Particularly, the high frequency power source 819 comes to a result that it does not contribute to causing plasma and because of this, it does not serve to supply energy. However, even in this case, plasma processing can be performed by applying a control voltage to the work electrode 109 from the work electrode voltage-controlling system 118 in the same manner as in the foregoing case and using energy to be supplied from the work electrode voltage-controlling system 118 as the energy for causing plasma, thereby causing plasma 806.

In this case, if the magnitude of a voltage when the work electrode voltage becomes negative is excessively small (about less than 100 V), no plasma is caused. Therefore, it is necessary to supply a relatively large electric power. In view of this, specific due regards should be made with respect to energy control for ions and ion damage for a work to be treated.

EXPERIMENT 1 AND COMPARATIVE EXPERIMENT 1

EXPERIMENT 1

In order to observe the effectiveness of the foregoing apparatus, an experiment was conducted for measuring ion energy impinged into a work. The measurement of the ion energy was performed using the ion energy measuring means in the apparatus shown in FIG. 1(a) which was modified as shown in FIG. 4.

In FIG. 4, numeral reference 436 stands for a small aperture provided at the work electrode 109, numeral reference 437 stands for an electron preventive electrode applied with mesh-like treatment at the center being connected to the work electrode 109, numeral reference 438 stands for a control electrode which serves to restrict ion energy capable of passing through, numeral reference 439 stands for a DC power source capable of varying the voltage which serves to vary said ion energy, numeral reference 442 stands for a DC power source for the electron preventive electrode, numeral reference 440 stands for an ion collecting electrode, and numeral reference 441 stands for an ammeter which serves to measure the current of an ion captured by said ion collecting electrode. Other constitution than that mentioned above is the same as that in the case of FIG. 1.

In the following, detailed explanation is to be made about the measuring method.

First, the vacuum vessel 103 was vacuum-evacuated to bring the inside to a vacuum of less than $10^{-6}$ Torr. Then, Ar gas was introduced through the gas inlet opening 105 at a flow rate of 20 sccm, and the vacuum-evacuated state was adjusted such that the pressure in the vacuum vessel 103 became $3 \times 10^{-4}$ Torr. Successively, an electric current of 150 A was flown to the air-cored coil 104 to produce a magnetic field of 875 Gauss in the vacuum vessel 103, and microwave (2.45 GHz) of 200 W was supplied through the microwave transmissive window 102, to thereby cause plasma 106.

As a specific measurement, voltage/current characteristics were observed with respect to each of the langmuir probes 115a and 115b and an electron temperature Te at each of the places was computed. As a result of the computation, there were obtained the values: $kTe\text{-}a = 2.3$ eV and $kTe\text{-}b = 2.5$ eV. The variation for these value in terms of time passage was within the range of $\pm 0.1$ eV. Thus these value were not substantially varied. In this experiment, there was employed a reduction ratio of 1/10 for each of the attenuators 112a, 112b and 112c.

There were observed $V_T\text{-}a$ and $V_T\text{-}b$ at the position for each of the langmuir probes. As a result, there were obtained 11.9 V and 13.0 V. Each of the DC power sources 150a and 150b was adjusted to input 1.19 V and 1.30 V into the plasma potential appreciating system 113.

In this experiment, a pulse generator 8112A available from HP Co., Ltd. was used as the reference waveform-outputting system 115, and the related conditions were set to be $t_1 = 20$ nsec, $t_2 = 1$ μsec, $V_1 0.5$ V, $V_2 5$ V, 10 V and 15 V. As each of the DC power sources 131 and 132, there were used those of 300 V and $-300$ V.

Ions and partial electrons arriving at the work electrode 109 pass through the small aperture 436, the electrons are prevented by the electron preventive electrode 437 applied with a negative voltage ($-50$ V)

through the work electrode 109, and only the ions pass through the electron preventive electrode 437. And, the ions which pass through the control electrode 438 and arrive at the ion collecting electrode 440 can be controlled by applying a voltage Vi to the control electrode 438 from the DC power source 439 and varying said voltage. The energy distribution of ion was obtained by measuring the electric current Ii of the ion captured by the ion collecting electrode 440 using the ammeter 441 to obtain Vi—Ii characteristics and computing the dIi/dVi.

Figure 5:
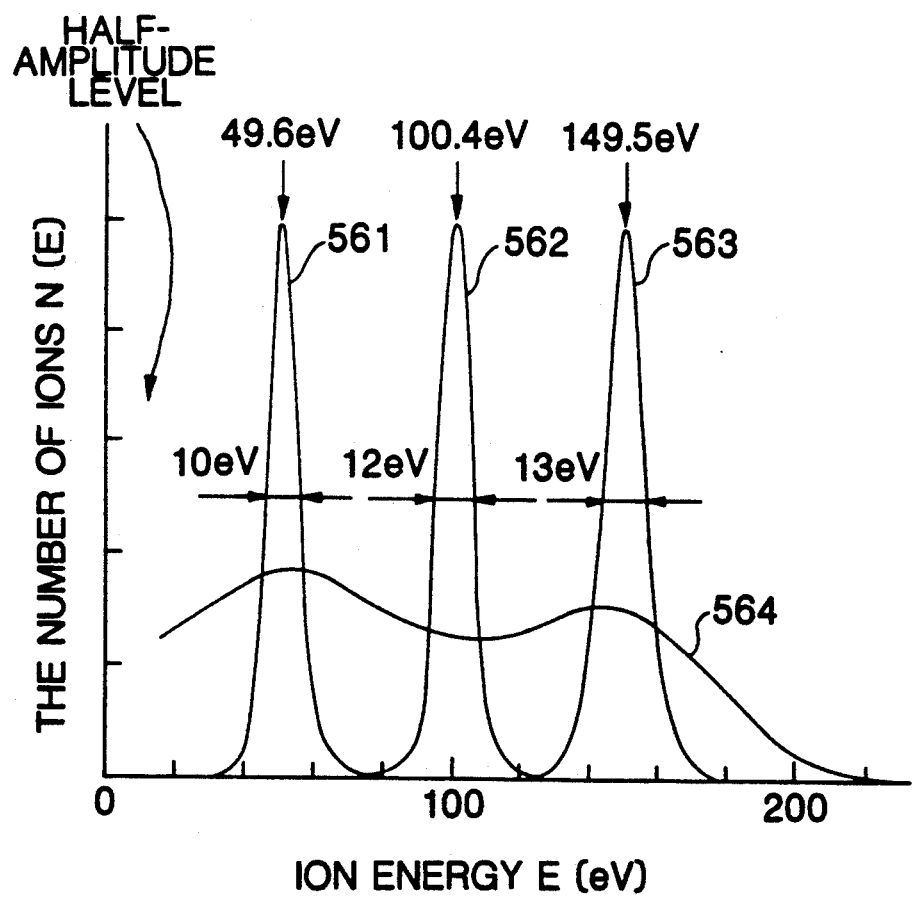
FIG. 5 is a graph showing the distribution of energy possessed by ion impinged into the work electrode.

The results obtained were shown in FIG. 5.

In the figure, the curves of numeral references 561, 62 and 563 are the energy distributions of ion obtained respectively at the time of $V_2 = 5$ V, 10 V and 15 V.

It was recognized that each of these energy distributions comprises an energy center of providing a maximum distribution and is of a single distribution having a sharp peak; the energy of providing such maximized distribution is almost precisely 10 holds over the Vi, particularly, the multiplying number of the reciprocal of the reduction ratio for the attenuator 112a, 112b or 112c; and the distribution width of energy, namely, the half-amplitude width, is 10 eV, 12 eV or 13 eV.

From the above measured results, it was found that for the energy of ion to be impinged into the work electrode, its distribution is small and it can be precisely set to a desired value by the $V_2$.

COMPARATIVE EXPERIMENT 1

Figure 6:
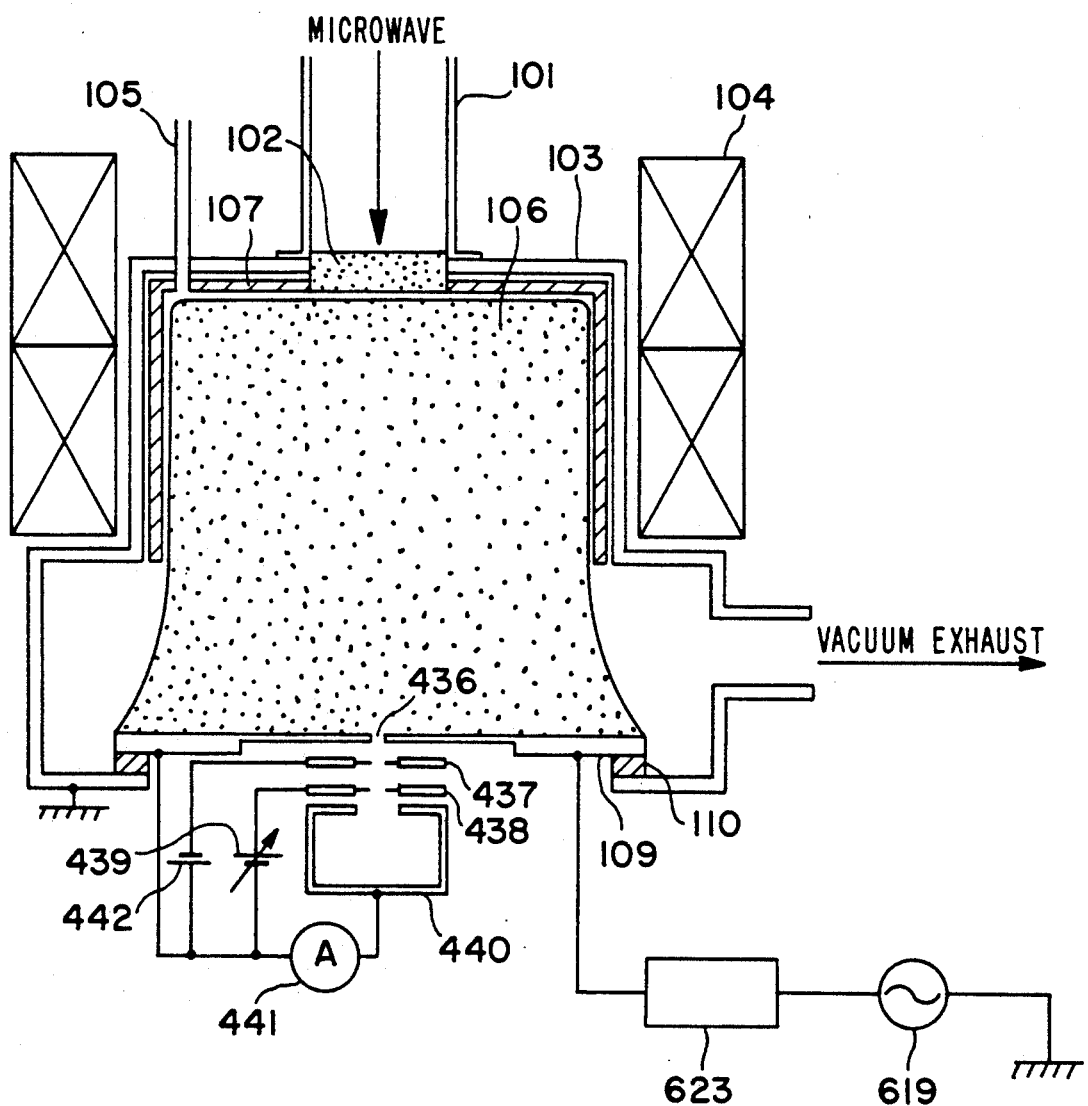
FIG. 6 is a schematic view illustrating an embodiment of the conventional plasma processing apparatus.

With respect to the work electrode, similar measurement was also performed by using a conventional apparatus of the constitution shown in FIG. 6 while applying a high frequency power.

In FIG. 6, numeral reference 619 stands for a frequency power source (13.56 MHz) of 500 W in outputting power which is capable of changing its outputting power, numeral reference 623 stands for a matching box, and the remaining numeral references other than these are of the same meanings as those designated by the corresponding numeral references in FIG. 4.

Plasma was caused under the same conditions and in the same manner as in the above. Thereafter, high frequency power of 240 W (13.56 MHz was applied, and the matching box 623 was adjusted so as to minimize reflected wave. The bias voltage of the work electrode at this time was −100 V. At this voltage, the average ion energy was equivalent to that at the time of $V_2 = 10$ V in the antecedent Experiment 1.

Hereupon, the energy distribution of ion impinged into the work electrode 109 was observed in the same manner as in the antecedent experiment.

Numeral reference 564 in FIG. 5 stands for the energy distribution of ion obtained in this comparative experiment. It was recognized that the energy of ion is widely distributed between 0 to 200 eV.

As is apparent from the experimental results obtained in the above two experiments, it was confirmed that in comparison with the case of using the conventional apparatus in which a high frequency power was applied to the work electrode, the energy distribution of ion arriving at the work electrode is markedly improved by practicing the present invention and ions with a completed energy distribution can be obtained.

Experiment 2

Using the apparatus shown in FIG. 4, there was appreciated the relationship between the $t_1$ and the $t_2$ of the signal relating to the reference waveform outputted by the reference waveform signal-outputting system 115 shown in FIG. 2.

Figure 7:
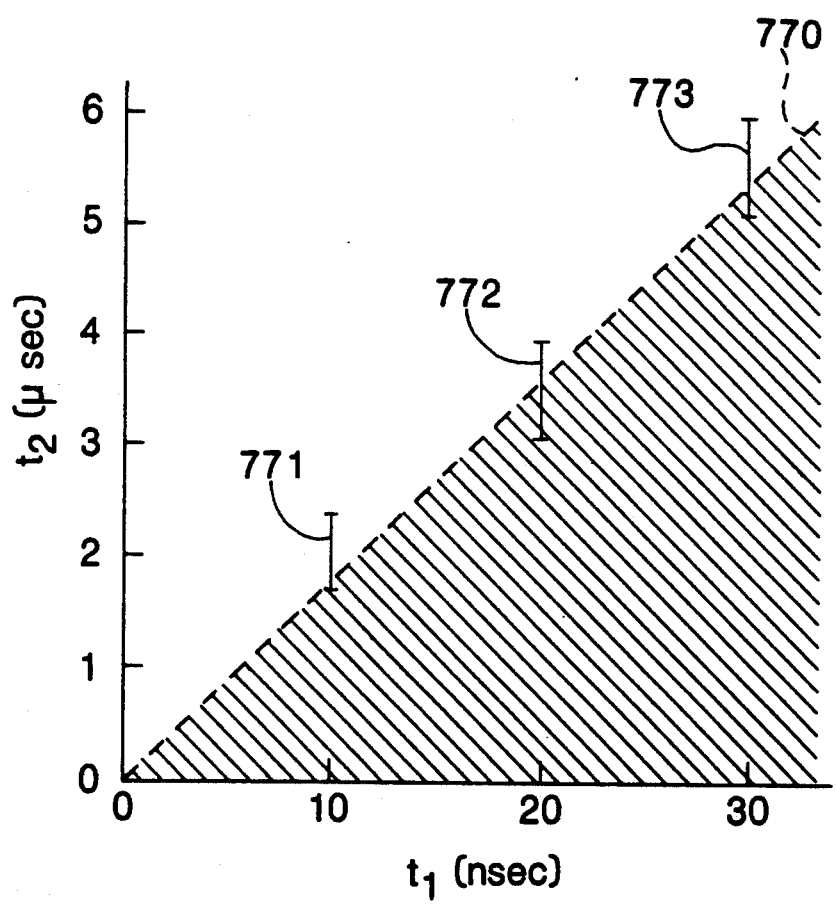
FIG. 7 is a graph showing the relationship between the $t_1$ and the $t_2$ of a reference waveform outputted by a reference waveform signal-outputting mechanism which is applicable as a constituent of the plasma processing apparatus of the present invention.

In the same manner as in the foregoing Experiment 1, there was caused Ar plasma, the energy distribution of ion impinged into the work electrode 109 was obtained, and the relationship between the $t_1$ and the $t_2$ wherein said energy distribution becomes to be of a single distribution was obtained at the respective times of $t_1$ 10, 20 and 30 nsec. The results obtained were shown in FIG. 7, wherein a broken line 770 stands for the linear line expressed by the equal sign of the foregoing equation (2), and the slanting line portion stands for the region expressed by the sign of inequality.

In each case where the $t_1$ was as above mentioned above, a stable single distribution was provided at the limit for the energy distribution to be a single distribution and at the $t_2$ being shorter than that in the range of the $t_2$ being such mentioned by numeral reference 771, 772 or 773. This exists substantially on the linear line 770. Thus, it was confirmed that the foregoing equation (2) is effective.

EXAMPLE 1 AND COMPARATIVE EXAMPLE 1

Example 1

There was provided a specimen to be treated as the work by forming a 100 Å thick thermally oxidized film on a p-type Si substrate and depositing a 4000 Å thick polycrystalline Si film doped with phosphorous on said oxidized film.

The resultant was subjected to etching in the apparatus shown in FIG. 1 to prepare a MOS structure.

That is, the above specimen was applied with a resist (available under the trademark name of OFPR-800, produced by Tokyo Ohkakohgyo Kabushiki Kaisha), followed by subjecting to exposure and development treatment by a conventional exposure device in the semiconductor field, to thereby resist pattern on the specimen.

In order to observe the electron temperature of plasma, a dummy specimen identical to the above specimen was placed on the work electrode 109, and the vacuum vessel 103 was vacuum-evacuated to bring its inside to a pressure of less than $10^{-6}$ Torr. Then, $Cl_2$ gas was introduced through the gas inlet opening 105 at a flow rate of 20 sccm, and the inner pressure of the vacuum vessel was adjusted to $3 \times 10^{-4}$ Torr. Electric current of 150 A was flown to the air-cored coil 104 to generate a magnetic field of 875 Gauss in the vacuum vessel 103 and concurrently, microwave (2.45 GHz) of 200 W was supplied through the microwave transmissive window 102, to thereby cause chlorine plasma 106. In this case, no voltage was applied from the work electrode voltage-controlling system 118.

Using the langmuir probes 111a and 111b, the voltage/current characteristics were observed for each of the langmuir probes to obtain an electron temperature of the plasma at the respective positions where each of the langmuir probes were situated. As a result, the electron temperature with respect to the langmuir probe 111a was kTe-a = 2.5 eV, and the electron temperature with respect to the langmuir probe 111b was kTe-b = 2.7 eV. The $V_T$ of the foregoing equation (1) was obtained based on these resultant values for the electron temperature. As a result, the $V_T$ at each of those positions, that is, the $V_T$-a and $V_T$-b were 12.8 eV and 13.9 eV respectively.

In this example, each of the attenuators 112a, 112b and 112c was set to a conversion rate of 1/10, and because of this, the outputting voltage of each of the setting DC power sources 150a and 150b was set to a voltage corresponding to 1/10 of the value of the $V_T$-a or $V_T$-b.

As for the parameters with respect to the time and voltage of the reference waveform signal outputted by the reference waveform signal-outputting system 115, they were set to be $t_1=20$ nsec, $t_2=1$ μsec, $V_1=0.5$ V and $V_2=10$ V respectively, in order to make the energy of ion to be impinged into the specimen to be 100 eV. And as the DC power sources 131 and 132, there were used a DC power source of 300 V in outputting voltage and a DC power source of −300 V in outputting voltage.

Next, the foregoing specimen 108 to be processed was placed on the work electrode 109. Thereafter, the above procedures employed in the case of the dummy specimen were repeated to cause chlorine plasma 106. A controlling voltage from the work electrode voltage controlling system 18 was applied to etch the polycrystalline Si with ions with complete energy, whereby a MOS structure having a polycrystalline Si electrode of 1 mm in diameter was prepared. The rate of etching the polycrystalline Si in this case was 6200 Å/min.

The resultant MOS structure was subjected to dielectric breakdown test by applying a voltage between its Si substrate and its polycrystalline Si electrode. As a result, the dielectric breakdown electric field of the MOS structure was 4 to 6 MV/cm.

COMPARATIVE EXAMPLE 1

Using an etching apparatus comprising the conventional apparatus shown in FIG. 6 from which the ion energy measuring mechanism situated under the work electrode 109 being removed, the procedures of Example 1 were repeated.

Specifically, a specimen of the same kind as in Example 1 was placed on the work electrode 109, chlorine plasma was caused by way of microwave energy, and high frequency power of 340 W (13.56 MHz) from the high frequency power source 619 was applied to the work electrode 109 to perform etching, whereby a MOS structure having a polycrystalline Si electrode of 1 mm in diameter was prepared. At this time, the bias voltage caused at the work electrode 109 was −100 V, and because of this, in average, the energy possessed by ion became the same as that in the case of Example 1. The etching rate in this case was 3400 Å/min.

As well as in the case of Example 1, the resultant was subjected to dielectric breakdown test by applying a voltage between its Si substrate and its polycrystalline Si electrode. As a result, the dielectric breakdown electric field of the MOS structure was 1 to 3 MV/cm.

The followings was found from the the results mentioned above. That is, in the case of Example 1, ion energies can be completed to be in a state suitable for etching in the range of not imparting ion damages to the SiO₂ film and because of this, the etching rate is increased and the breakdown voltage of an element is improved in comparison with Comparative Example 1.

In consequence, according to the plasma processing method and apparatus of the present invention, energy of ion can be completed to be in a desired state and because of this, desirable plasma processing can be performed with an improved efficiency.

EXAMPLE 2 AND COMPARATIVE EXAMPLE 2

EXAMPLE 2

Using the apparatus shown in FIG. 8, a 2000 Å thick hydrogenated amorphous silicon nitride film (a-SiN:H) was formed on a Si substrate.

That is, a dummy Si substrate 108 was placed on the work electrode 109 being maintained at 300° C. by means of a heater (not shown in the figure) installed in the work electrode 109. The dummy substrate was heated to and maintained at 300° C. The vacuum vessel 803 was vacuum-evacuated to bring its inside to a pressure of less than $10^{-6}$ Torr. Successively, SiH₄ gas, N₂ gas and H₂ gas were introduced through the gas inlet opening 805 at respective flow rates of 3 sccm, 100 sccm and 40 sccm, and the inner pressure of the vacuum vessel was adjusted to 0.6 Torr.

As the high frequency power source 819, there was used a high frequency power source of 300 W (100 MHz) in outputting power. The switch 821 was positioned on the side of the high frequency power source 819. Then, a high frequency power was applied to the upper electrode 820, and the matching box was adjusted such that reflected wave became minimum. In this way, there was caused plasma 806 between the upper electrode 820 and the work electrode 109. In this case, no voltage was applied from the work electrode voltage-controlling system 118.

In the same manner as in Example 1, there was observed an electron temperature of the plasma at the respective positions where each of the langmuir probes 111a and 111b were situated. As a result, the electron temperature with respect to the langmuir probe 111a was kTe-a=3.3 eV, and the electron temperature with respect to the langmuir probe 111b was kTe-b=3.1 eV. The $V_T$ of the foregoing equation (1) was obtained based on these resultant values for the electron temperature. As a result, the $V_T$ at each of those positions, that is, the $V_T$-a and $V_T$-b were 16.6 eV and 15.6 eV respectively.

In this example, each of the attenuators 112a, 112b and 112c was set to a conversion rate of 1/10, and because of this, the outputting voltage of each of the setting DC power sources 150a an 150b was set to a voltage corresponding to 1/10 of the value of the $V_T$-a or $V_T$-b.

A for the parameters with respect to the time and voltage for the reference waveform signal outputted by the reference waveform signal-outputting system 115, they were set to be $t_1=20$ nsec, $t_2=0.8$ μsec, $V_1$0.3 V and $V_2=3$ V respectively, in order to make the energy of ion to be impinged into the specimen to be 30 eV. And as the DC power sources 131 and 132, there were used a DC power source of 300 V in outputting voltage and a DC power source of −300 V in outputting voltage.

Next, a Si substrate 108 as the work to be processed was placed on the work electrode 109. Thereafter, the above conditions and procedures employed in the case of the dummy specimen were repeated to cause plasma 806.

A controlling voltage from the work electrode voltage-controlling system 118 was applied, and a 2000 Å thick a-SiN:H film was formed on the Si substrate by way of a plasma CVD method using ions with a complete energy. The deposition rate in this case was 14 nm/min. Thereafter, an Al electrode was formed on the resultant a-SiN:H film, followed by subjecting to dielectric breakdown test. As a result, the dielectric breakdown electric field of the resultant a-SiN:H film was 10 to 12 MV/cm.

COMPARATIVE EXAMPLE 2

Using a plasma processing apparatus comprising the apparatus shown in FIG. 8 from which the work electrode voltage 118 and the attenuator 112 being removed, and the work electrode 109 being grounded (that is, being electrically connected to the vacuum vessel), without using the langmuir probes 111a and 111b, the procedures of Example 2 were repeated to form a 2000 Å thick a-SiN:H film on a Si substrate. The deposition rate in this case was 11 nm/min. In the same manner as in Example 2 was formed on the resultant a-SiN:H film, followed by subjecting to dielectric breakdown test. As a result, the dielectric breakdown electric field of the resultant a-SiN:H film was 5 to 7 MV/cm.

The following was found from the results mentioned above. That is, the a-SiN:H film deposited according to the method and the apparatus of the present invention is surpassing the a-SiN:H film deposited according to the conventional method with respect to deposition rate and breakdown voltage. According to the plasma processing method and apparatus, desirable plasma processing can be performed with an improved efficiency.

I claim:

1. A plasma processing method comprising introducing a processing gas into a vacuum vessel containing a work to be processed placed on a work electrode, applying a plasma generating energy to said processing gas to generate plasma and processing said work to be processed with said plasma, comprising the steps: repeating alternately a first step and a second step;

the first step comprising carrying out ion irradiation by applying a negative voltage to said work electrode while controlling said voltage such that the voltage of said work electrode versus the potential of said plasma is maintained constant, thereby making the energy possessed by ion to be irradiated to said work to be processed to provide an energy dispersed state as desired; and the second step comprising irradiating electrons in said plasma to said work to be processed by applying a positive voltage to said work electrode.

2. The plasma processing method according to claim 1, wherein the plasma generating energy is microwave energy or high frequency energy.

3. A plasma processing apparatus comprising a vacuum vessel having an electrode on which a work to be processed is to be placed, said vacuum vessel confining plasma for performing plasma processing for said work; comprising:

a gas supply means for supplying into said vacuum vessel a processing gas to be used for said plasma processing for said work;

an exhaust means for vacuum-evacuating the inside of said vacuum vessel;

and a voltage applying means for applying a voltage to said work electrode and controlling ions in said plasma to be impinged into said work to be processed, said voltage applying means designed such that a positive voltage and a negative voltage are allowed to be alternately applied to said work electrode, and the voltage of said work electrode versus the potential of said plasma controlled to be constant when the voltage of said work electrode versus the potential of said plasma is negative.

* * * * *

UNITED STATES PATENT AND TRADEMARK OFFICE
CERTIFICATE OF CORRECTION

PATENT NO. : 5,242,561
DATED : September 7, 1993
INVENTOR(S) : YASUE SATO

It is certified that error appears in the above-identified patent and that said Letters Patent is hereby corrected as shown below:

IN THE DRAWINGS

Figure 9:
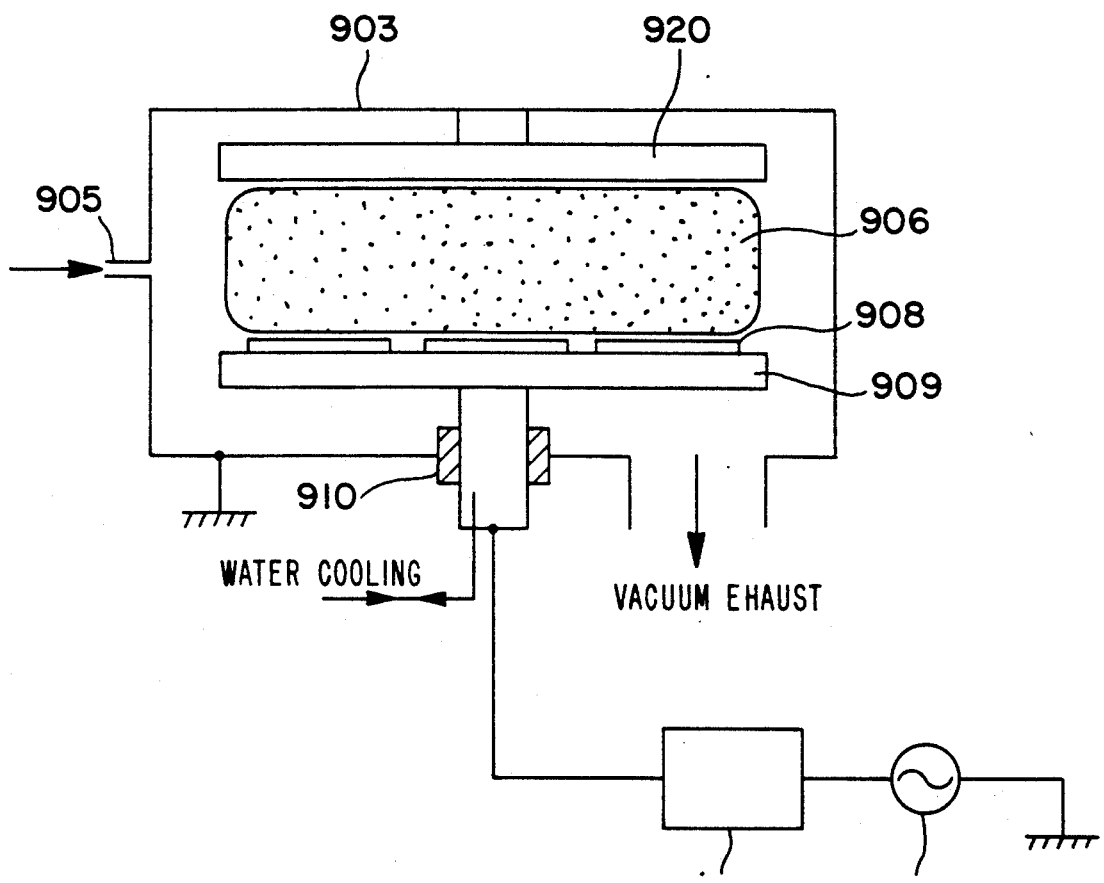
FIG. 9 is a schematic view illustrating an embodiment of the conventional plasma processing apparatus.
Figure 10:
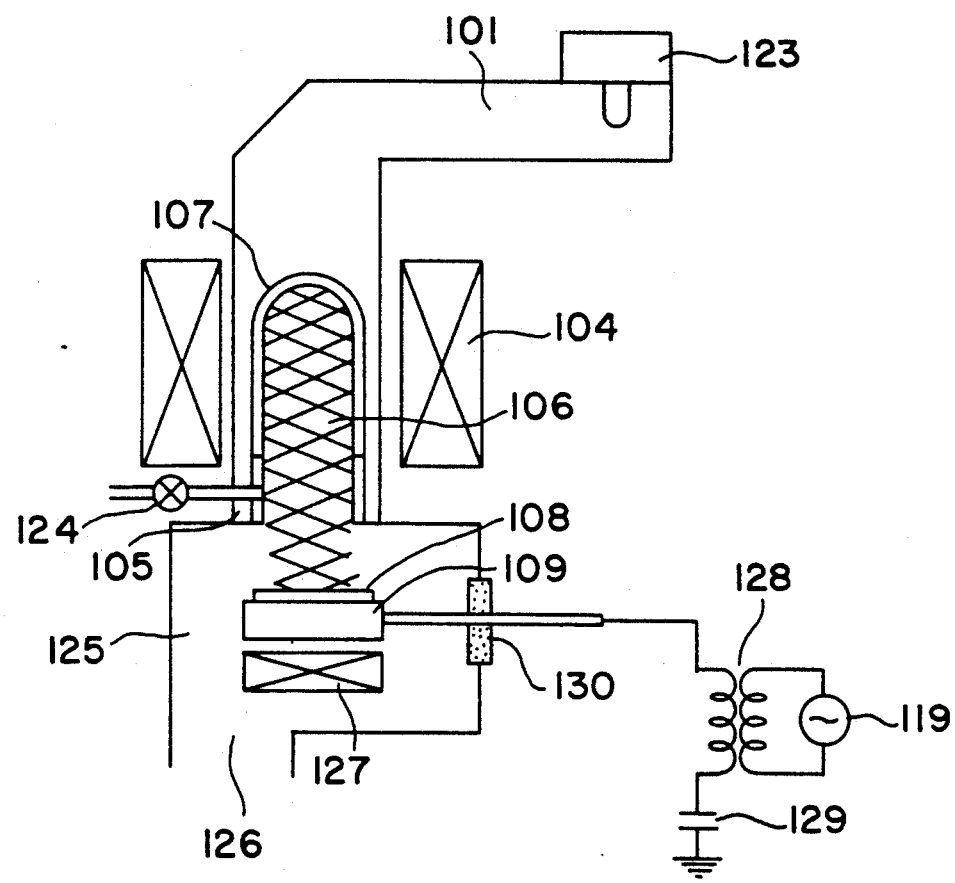
FIG. 10 is a schematic view illustrating an embodiment of the conventional plasma processing apparatus.
Figure 11:
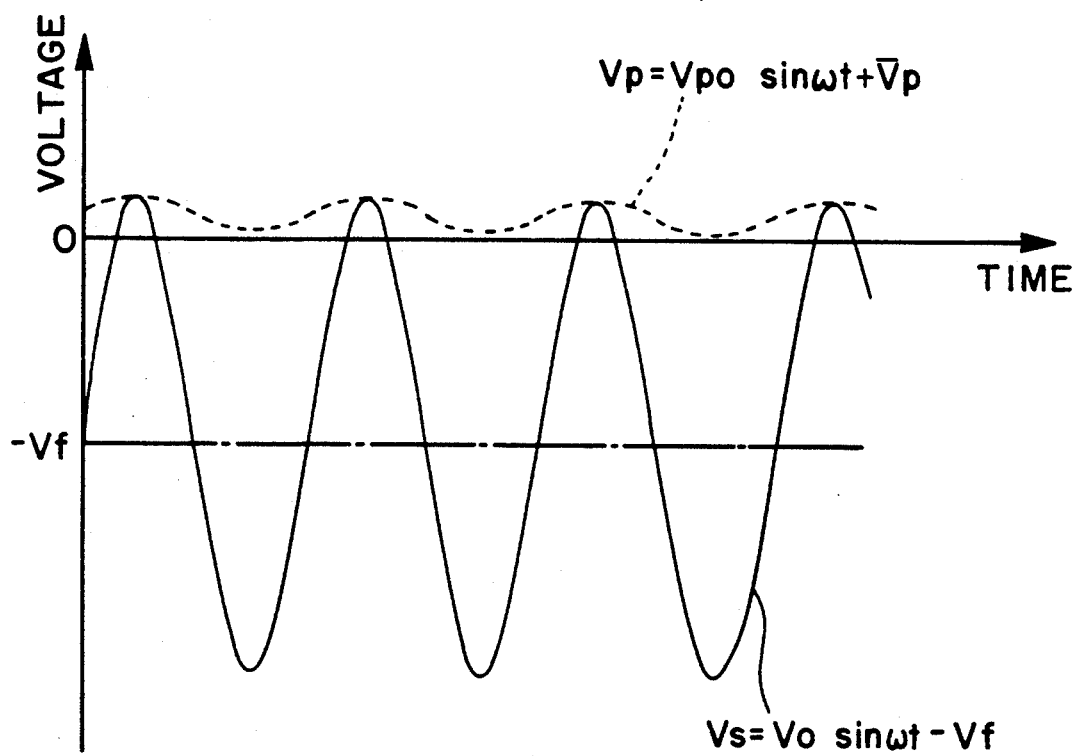
FIG. 11 is a graph showing changes of a voltage applied to the work electrode.
Figure 12:
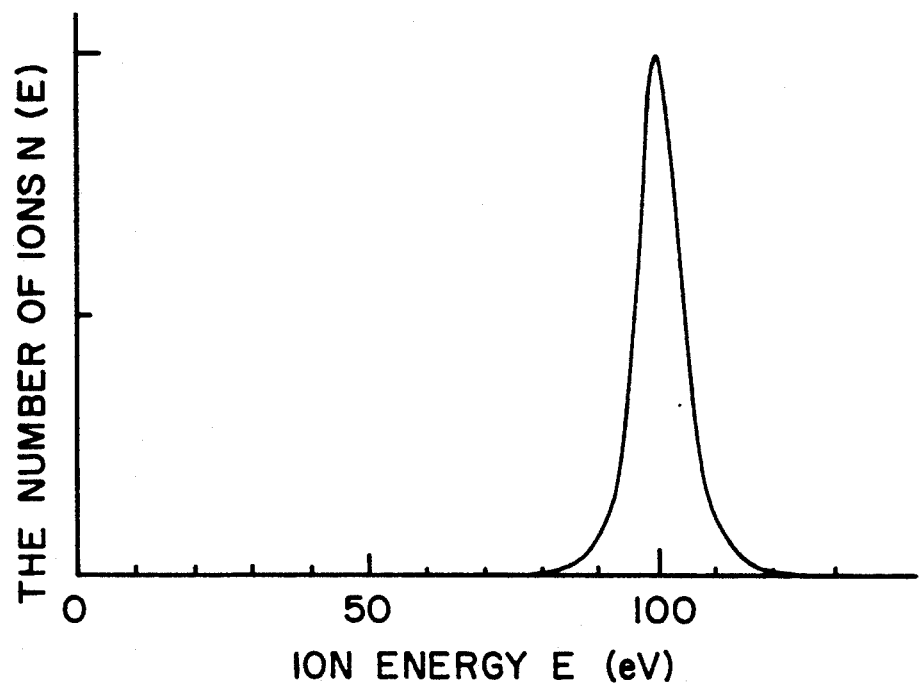
FIG. 12 is a graph showing the relationship between the ion energy and the number of ions.
Figure 13:
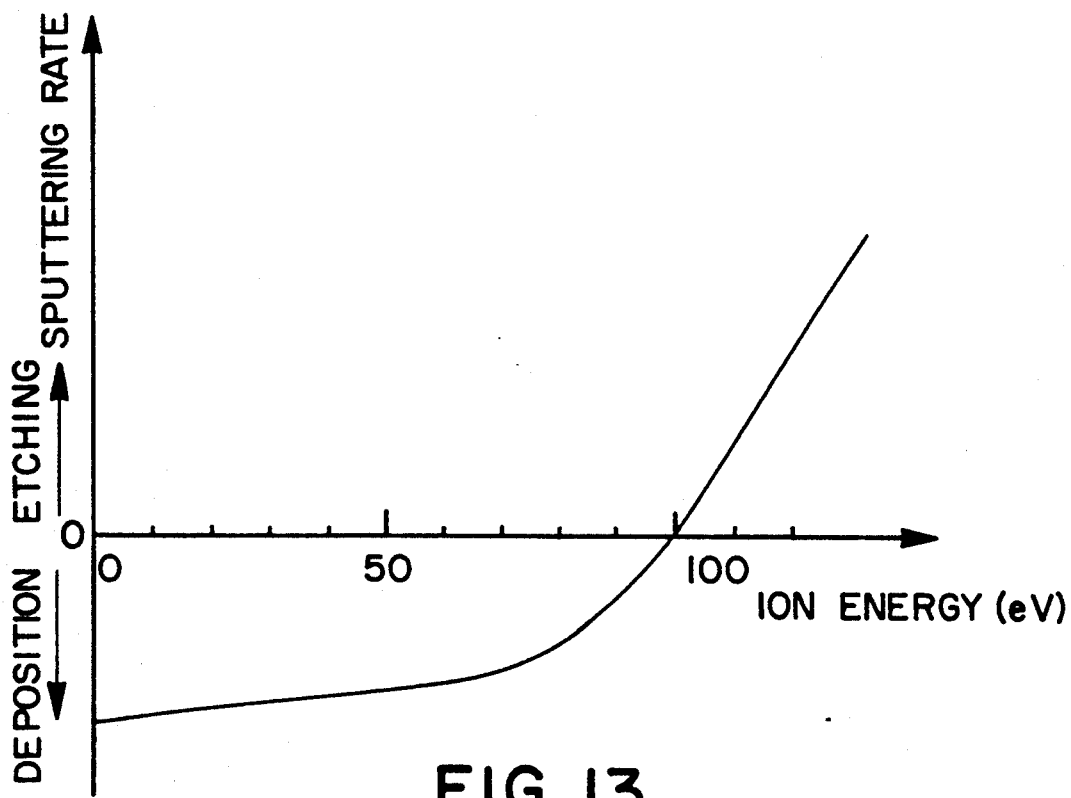
FIG. 13 is a graph showing the ion energy and the sputtering rate.

Sheet 9 of 12, FIG. 9, "EHAUST" should read --EXHAUST--.

COLUMN 1

Line 39, "rying" should read --ry--.
Line 51, "see," should read --(See,--.

COLUMN 3

Line 45, "Vf(Vf)$\overline{Vp}$)." should read --Vf(Vf»$\vec{Vp}$).--.

COLUMN 4

Line 20, "and" should be deleted.
Line 28, "a" (first occurrence) should be deleted.

COLUMN 5

Line 50, "sa" should read --a--.

COLUMN 8

Lines 9-10, "$\}\}$" should read --$\}$--.

COLUMN 9

Line 29, "obtained" should read --maintained--.

UNITED STATES PATENT AND TRADEMARK OFFICE
CERTIFICATE OF CORRECTION

PATENT NO. : 5,242,561
DATED : September 7, 1993
INVENTOR(S) : YASUE SATO

It is certified that error appears in the above-identified patent and that said Letters Patent is hereby corrected as shown below:

COLUMN 11

Line 6, "t" should read --to--.

COLUMN 12

Line 48, "value" should read --values--.
Line 49, "value" should read --values--.
Line 62, "$V_1 0.5$ V, $V_2 5$ V," should read --$V_1 = 0.5V$, $V_2 = 5V$,--.

COLUMN 13

Line 13, "561, 62" should read --561, 562--.
Line 17, "of" should be deleted.
Line 20, "10 holds" should read --10 fold--.
Line 22, "attenuator" should read --attenuators--.

COLUMN 14

Line 8, "becomes" should read --comes--.
Line 15, "above" should be deleted.
Line 25, "Example 1" should read --EXAMPLE 1--.

COLUMN 15

Line 37, "being" should read --was being--.

UNITED STATES PATENT AND TRADEMARK OFFICE
CERTIFICATE OF CORRECTION

PATENT NO. : 5,242,561
DATED : September 7, 1993
INVENTOR(S) : YASUE SATO

It is certified that error appears in the above-identified patent and that said Letters Patent is hereby corrected as shown below:

COLUMN 16

Line 51, "$V_1 0.3V$" should read --$V_1 = 0.3V$--.

Signed and Sealed this

Thirteenth Day of September, 1994

Attest:

BRUCE LEHMAN

Attesting Officer     Commissioner of Patents and Trademarks